United States Patent [19]

Harvey

[11] Patent Number: 5,352,987
[45] Date of Patent: Oct. 4, 1994

[54] ANALOG MULTIPLEXER

[75] Inventor: Barry Harvey, Los Altos, Calif.

[73] Assignee: Elantec, Inc., Milpitas, Calif.

[21] Appl. No.: 95,285

[22] Filed: Jul. 21, 1993

[51] Int. Cl.⁵ .................... H03F 3/68; H03K 17/56
[52] U.S. Cl. ............................ 330/51; 307/243;
330/147; 330/295; 330/252
[58] Field of Search ............ 330/51, 147, 295, 124 R,
330/252; 307/243; 328/104, 154; 370/27, 112

[56] References Cited

FOREIGN PATENT DOCUMENTS 4170814  6/1992  Japan ................................ 307/243

Primary Examiner—James B. Mullins
Attorney, Agent, or Firm—Albert C. Smith

[57] ABSTRACT

An analog multiplier includes a plurality of input stages that are selectively coupled to inputs of a common amplifier through coupling elements and logic circuitry that selectively controls conduction through the coupling elements to the amplifier. The coupling elements include transistors that are common base connected to a bias supply for shunting capacitive feed through to the amplifier.

1 Claim, 3 Drawing Sheets

ANALOG MULTIPLEXER

FIELD OF THE INVENTION

This invention relates to multiplexer switches and more particularly to semiconductor circuitry for multiplex switching of analog signals with high degree of isolation though nonconductive or inactive input stages.

BACKGROUND OF THE INVENTION

Multiplexed amplifiers commonly have several input stages that can be selected to be active one at a time. Such circuits behave as analog multiplexers with different signal sources connected to each input stage. One convenient configuration of an analog multiplexer is illustrated in FIG. 1 in which a common current source 9 is selectively connected to an activated input stage 11, 12, 13 of the main amplifier 15. The nonactivated input stages are capable of "floating" to some undetermined bias condition. One disadvantage of such circuit configuration is that the base-collector capacitance of the transistors in each input stage that is not active is capable of transferring high-frequency signal appearing on the input base to the main amplifier 15, thus resulting in poor signal isolation through the inactive input stages. Another disadvantage of such circuit configuration is that, when a previously inactive input stage is activated, its previous emitter voltage is unknown. Thus, undetermined time is required for the current source 9 to transfer charge and bias the emitters of the activated input stage to conduction.

SUMMARY OF THE INVENTION

In accordance with the present invention, a plurality of input stages of an analog multiplexer are each connected to current sources and are coupled to inputs of the main amplifier via isolating coupling transistors. Logic controllers are connected to the input stages to maintain all of the stages in the conductive condition for selectively conducting currents away from the coupling transistors to effectively disconnect and isolate non-selected input stages. Isolation is enhanced by the coupling transistors which have the base electrodes connected to a bias supply to effectively shunt the capacitive-coupled feedthrough of high-frequency signals.

DESCRIPTION OF THE PREFERRED EMBODIMENT

Figure 1:
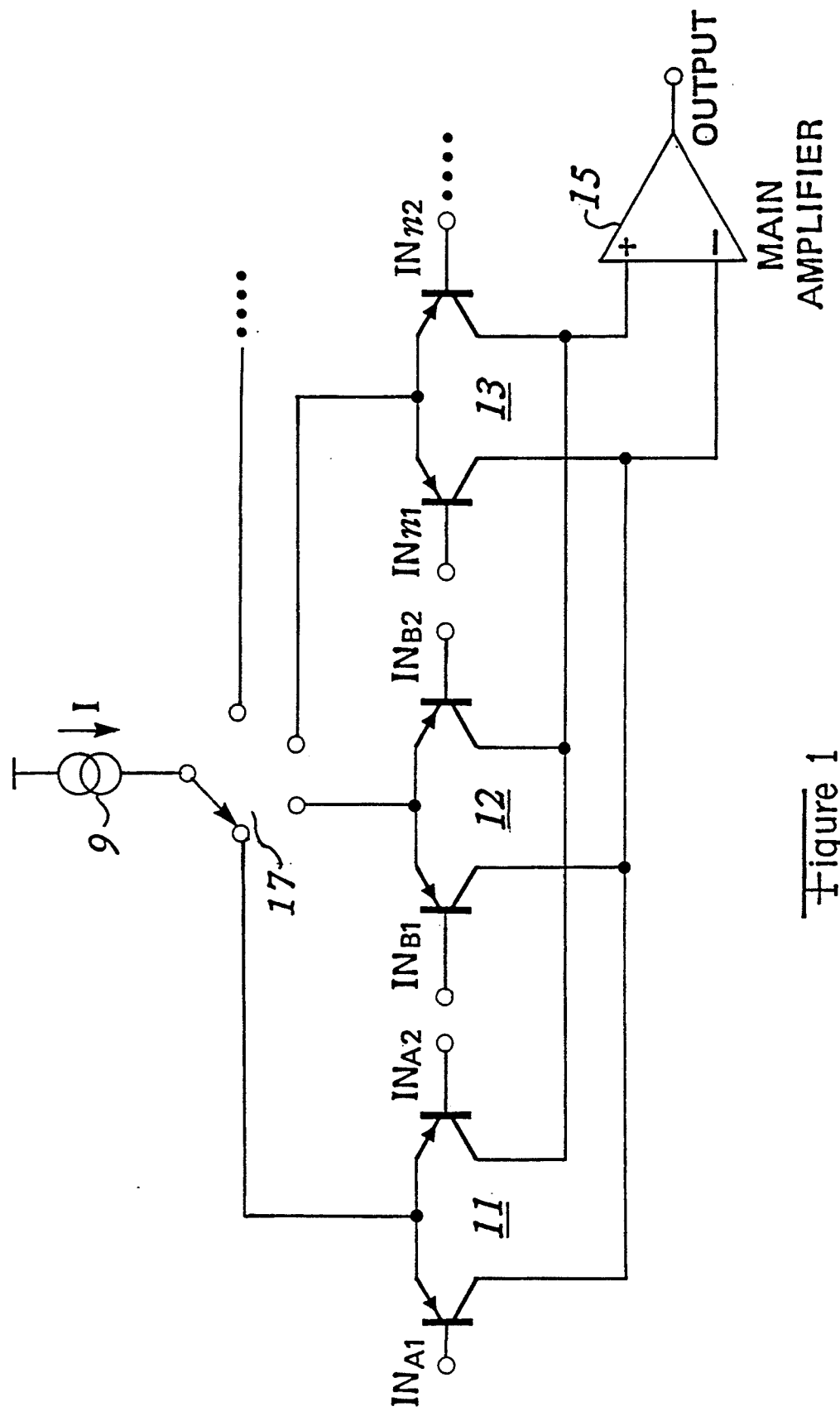
FIG. 1 is a schematic diagram of a conventional analog multiplexer.

Referring to the schematic diagram of FIG. 1, each of the input states of an analog multiplexer includes a differential pair of transistors of one conductivity type (e.g., PNP) with the emitters commonly connected through a selector switch 17 to a current source (e.g. a high-resistance component connected to a high-voltage bias supply), and with the collectors connected to differential inputs of the main amplifier 15. The bases of the pairs of transistors in each input stage 11-13 may be connected to signal sources that are to be selectively coupled to the main amplifier 15 via activation of selected input stages.

In this circuit configuration, the selector switch 17 connects the current source 9 to the common emitters of the transistors irk one of the input stages 11-13 that is active, while the common emitters of the transistors in the inactive input stages 'float' to some undetermined level of bias voltage. In addition, the collector-base capacitance of each transistor in the input stages 11-13 transfers signal appearing on the input bases $IN_{A-N}$ to the collectors that are connected to the inputs of the main amplifier 15, resulting in poor isolation of signals via the inactive input stages. Further, the emitters of the transistors in the input stages which were previously off, or not selected to couple signal from inputs $IN_{A-N}$ to the main amplifier 15, were at undetermined levels of bias voltage. Thus, as the current source 9 is switched to a selected pair of transistors in an input stage via selection switch 17, the time required to accumulate charge and pull the emitters to the desired bias level will vary depending on the level to which the emitters previously "floated". These aspects of the conventional analog multiplexer contribute undesirable variations in switching and poor signal isolation through inactive input stages.

Figure 2:
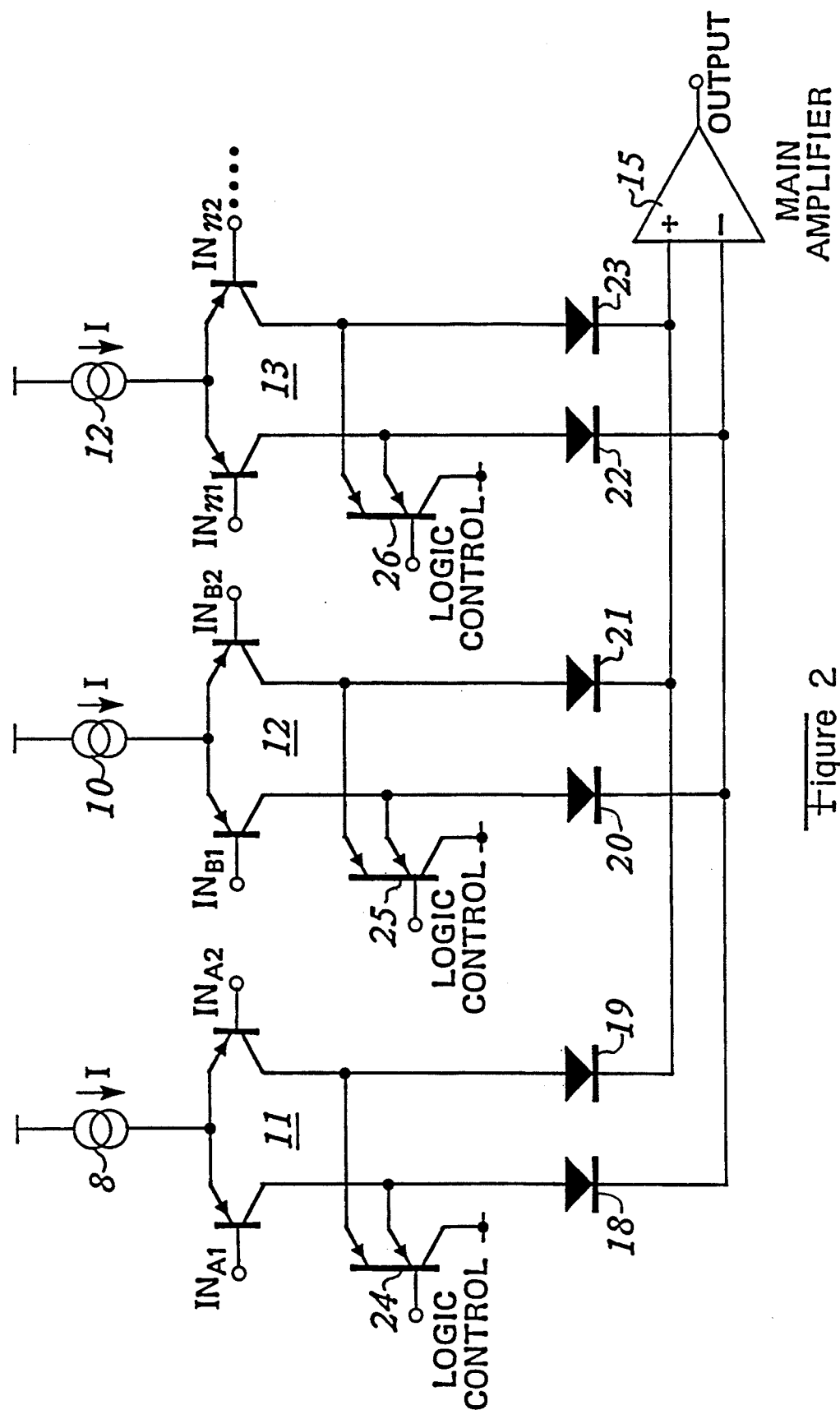
FIG. 2 is a schematic diagram of a conventional analog multiplexer with diode coupling elements.

Referring now to FIG. 2, there is shown a schematic diagram of a conventional analog multiplexer in which the collectors of the pair of transistors in the input stages 11-13 are coupled to the inputs of the main amplifier 15 via forward-biased diodes 18-23. Current sources 8, 10, and 12 are coupled to the common emitters of the transistors in the input stages, and PNP followers 24, 25, and 26 are coupled to the collectors of the input stage transistors to receive logic control signals at their bases to bias them to conduct the collector currents of the input stage transistors, and thereby maintain all of the input stages in the conductive states. One, or more, of the logic control signals applied to the PNP followers 24-26 that attains more positive voltage level does not extract collector current from the associated pair of coupling diodes 18-19, 20-21, 22-23, and that input stage becomes active and coupled via the associated diodes to the main amplifier 15. The remaining PNP followers 24 or 25 or 26 are conductive to divert collector currents from the associated coupling diodes which are rendered non-conductive to effectively disconnect the associated input stages 11-13 from the main amplifier 15. However, as the frequencies of signals applies to the input stages of 11-13 increase, the emitter impedances of the PNP followers 24-26 also increase. This impresses a high frequency signal of increasing amplitude with frequency upon the coupling diodes 18-23. Thus, although the diodes associated with a non-selected input stage may be off for D.C. bias considerations (due to the associated PNP followers conducting the collector currents of the associated transistors), the diode capacitance nevertheless transfers the high-frequency signals therethrough to the inputs of the main amplifier 15.

Figure 3:
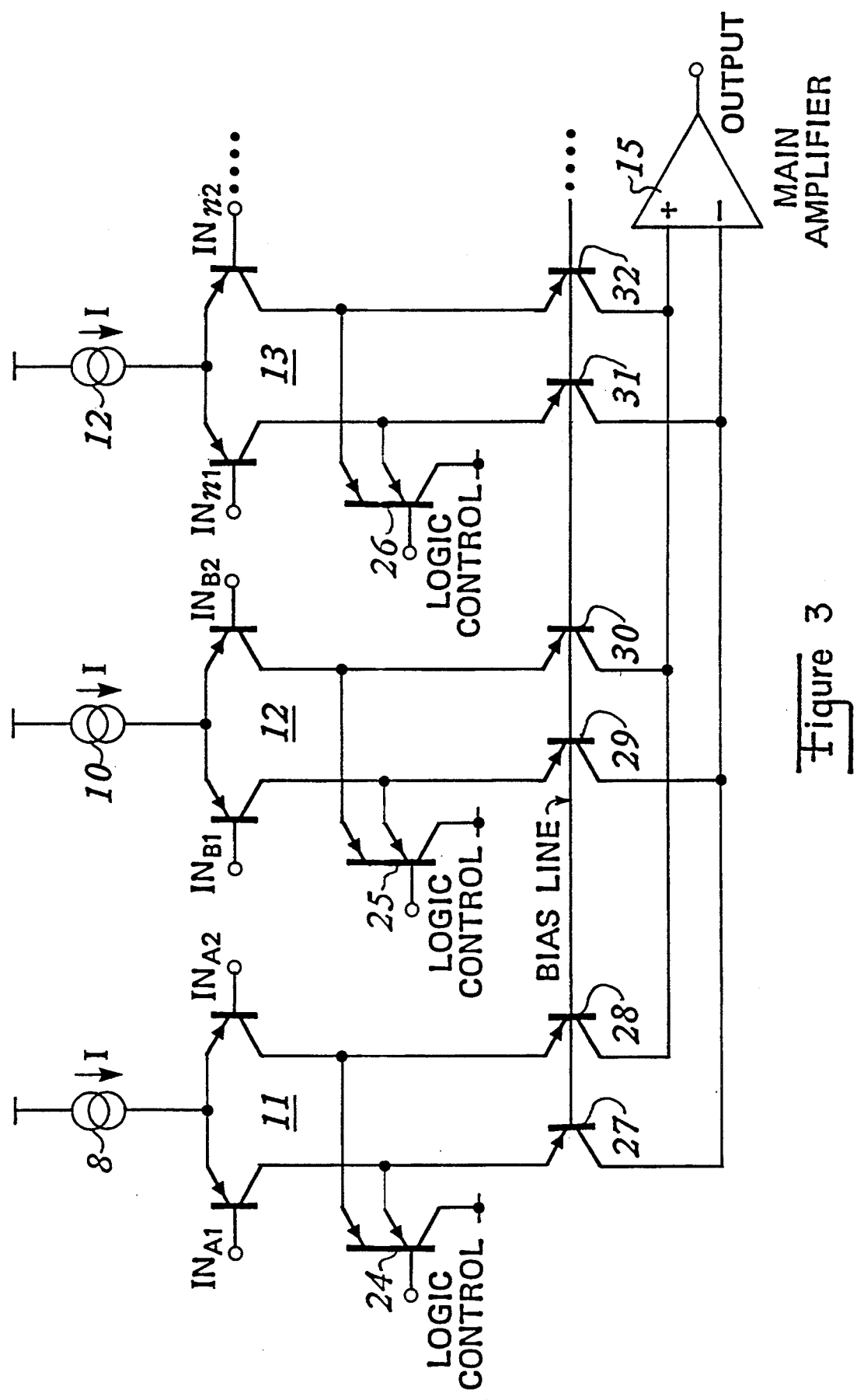
FIG. 3 is a schematic diagram of an analog multiplexer with enhanced signal isolation according to the present invention.

Referring now to FIG. 3, this is shown a schematic diagram of an improved analog multiplexer in which the coupling diodes of FIG. 2 are replaced by coupling transistors 27-32 which are biased in con, non base configuration. In this configuration, the base-emitter capacitance of the coupling transistors 27-32 effectively couples high frequency signal to the bias supply connected to the bases of the transistors 27-32, and is effectively shunted away from the inputs to the main amplifier 15.

Therefore, the analog multiplexer in the present invention provides good isolation through inactive input stages and provides repeatable turn-on characteristics of the input stages that are selectively coupled to the main amplifier.

What is claimed is:

1. An analog multiplexer comprising:
   an amplifier including a pair of inputs for forming an output from signals appearing on the pair of inputs thereof;
   a plurality of input stages, each including a pair of transistors of one conductivity type having bases and collectors and having emitters commonly connected to receive bias signal;
   logic means including emitter followers of the one conductivity type with emitters connected to the collectors of the transistors in each of the input stages for selectively shunting collector currents therethrough in response to applied logic signals; and
   a coupling transistor of the one conductivity type stage, each coupling transistor having an emitter connected to the collector of each transistor in each of the input stages, and having a collector connected to one of the pair of inputs of the amplifier, and having a base connected to a source of bias signal for selectively conducting signal through the coupling transistors to the inputs of the amplifier in response to the associated logic means not conducting signal therethrough.

* * * * *